(12) United States Patent
Taira et al.

(10) Patent No.: US 6,340,982 B1
(45) Date of Patent: Jan. 22, 2002

(54) IMAGE FORMING APPARATUS AND EXPOSURE DEVICE THEREOF

(75) Inventors: Yoshihiko Taira; Youji Houki; Hirofumi Nakayasu; Tsutomu Nagatomi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/608,147

(22) Filed: Jun. 30, 2000

(30) Foreign Application Priority Data

Oct. 15, 1999 (JP) .......................................... 11-294150

(51) Int. Cl.[7] .......................... B41J 2/385; G03G 13/04
(52) U.S. Cl. ...................... 347/130; 347/134; 347/137; 347/241; 347/244; 347/258
(58) Field of Search ................................ 347/130, 134, 347/137, 138, 148, 238, 241, 242, 244, 245, 256, 257, 258, 263

(56) References Cited

U.S. PATENT DOCUMENTS

| | | | |
|---|---|---|---|
| 4,347,785 A | * 9/1982 | Chase et al. ............. 347/257 X |
| 4,476,474 A | 10/1984 | Kitamura | |
| 5,896,162 A | * 4/1999 | Taniguchi ................... 347/244 |
| 6,025,863 A | * 2/2000 | Nakajima et al. ........... 347/238 |
| 6,169,564 B1 | * 1/2001 | Tsukagoshi et al. ........ 347/238 |
| 6,243,125 B1 | * 6/2001 | Yuge et al. .................. 347/241 |

FOREIGN PATENT DOCUMENTS

| JP | 57-173857 | 10/1982 |
|---|---|---|
| JP | 6-118319 | 4/1994 |
| JP | 9-282708 | * 10/1997 |

* cited by examiner

*Primary Examiner*—Susan S. Y. Lee
(74) *Attorney, Agent, or Firm*—Armstrong, Westerman, Hattori, McLeland & Naughton, LLP (57) ABSTRACT

An exposure device in which an image forming lens is disposed in such a posture that the center line of an image forming is out of axial alignment with the center of beam intensity distribution of the light emitting diode output (the center of beam intensity distribution) so as to reduce possible incidence of stray light when local part of the light output from the light emitting diode array reflects on said wires. As a result, the stray light does not strikes the circumference surface of the image supporting body and the vivid image can be formed.

11 Claims, 10 Drawing Sheets

IMAGE FORMING APPARATUS AND EXPOSURE DEVICE THEREOF

BACKGROUND OF THE INVENTION

1. Field of the Invention

The present invention relates to an exposure device and an image forming apparatus suitable for an electrophotographic apparatus.

2. Description of Related Art

Figure 9:
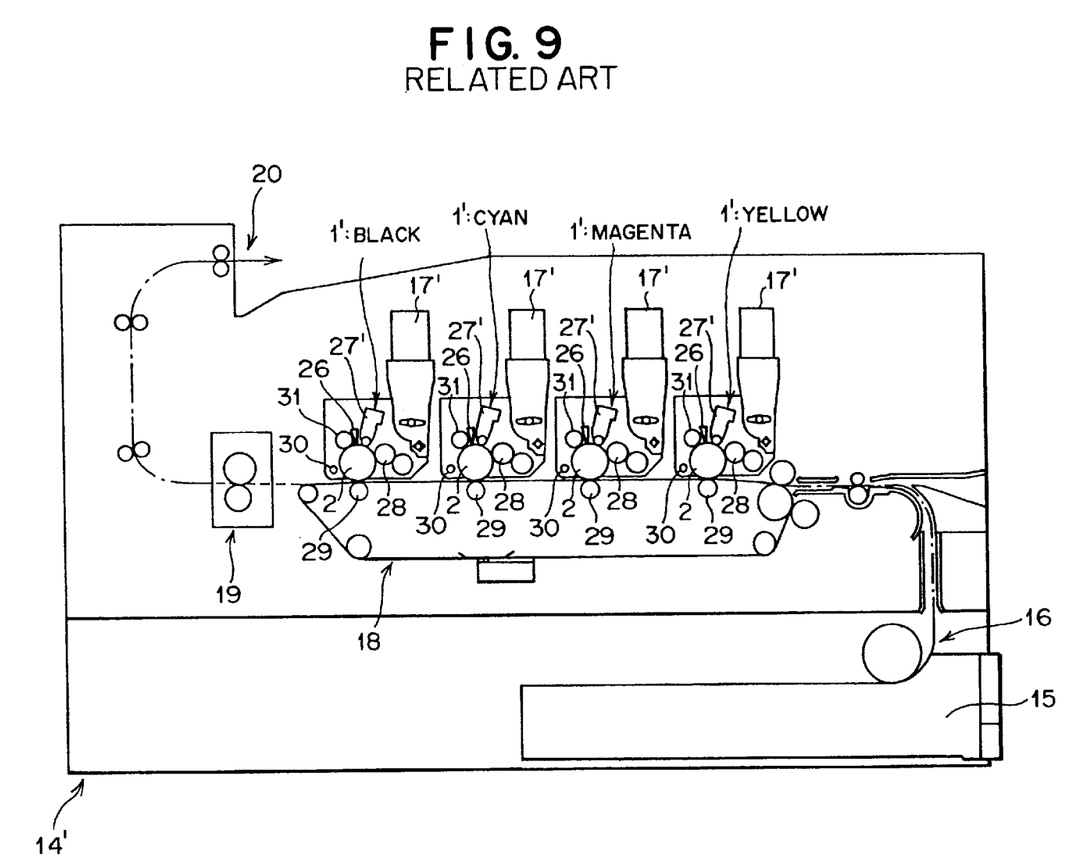
FIG. 9 is a side elevational view schematically showing an LED printer according to the related art.

FIG. 9 of the accompanying drawings schematically shows a side elevational view of an LED (light emitting diode) printer. An LED printer 14' is equipped with a paper cassette 15, four printing units 17', a conveying belt 18, a fixing unit 19, and an outlet port 20.

The LED printer 14' prints a color image on paper 16 using toners of four colors, yellow, magenta, cyan and black, and includes four printing units 17', which are substantially identical in construction, one for each of the four colors, and are arranged in series along the travelling path of the paper 16.

The photosensitive drum 2 of the individual printing unit 17' is disposed so as to extend perpendicularly across the traveling path of the paper 16. The charging unit 26, the exposure unit 27', the developing unit 28, the transferring unit 29, the discharging unit 30 and the cleaning unit 31 are arranged on and around the circumference of the photosensitive drum 2 for performing the respective functions while the photosensitive drum 2 makes a single rotation.

The paper cassette 15 holds the paper 16, which is not printed yet, to supply and deliver it to the printing units 17' as a demand arises, and the conveying belt 18 conveys the paper 16 to the individual printing units 17'.

The fixing unit 19 fixes a toner image formed in the printing units 17', and the outlet port 20 allows the paper 16, which has been printed in color, to be removed out of the LED printer 14'.

Color-printing is performed on the LED printer 14' in the following manner. The paper cassette 15 delivers one sheet of the paper 16 at a time onto the conveying belt 18. The conveying belt 18 then brings the paper 16 to the printing units 17' where the individual printing units 17' sequentially form toner images of colors of yellow, magenta, cyan and black.

In the individual printing unit 17', the charging unit 26 electrically charges the circumferential surface of the photosensitive drum 2 uniformly. Then the exposure unit 27' forms an electrostatic latent image on the circumferential surface of the photosensitive drum 2 in accordance with an original image to be printed. Then the developing unit 28 develops the latent image with toner, bringing the latent image into a visible image of the toner. After that, the transferring unit 29 transfers the toner of the visible image to the paper 16, at which time the toner image on the paper 16 is not fixed yet.

After the toner image is transferred to the paper 16, the discharging unit 30 discharges the circumferential surface of the photosensitive drum 2, whereupon the cleaning unit 31 removes residual toner.

Subsequently in the first printing unit 17', the paper 16 to which toner image of the first primary color (yellow) transferred by the transferring unit 29 is conveyed to the second printing unit 17' on the conveying belt 18. Then in the second printing unit 17', third and fourth printing units 17', toner image in the same printing process as in the first printing unit 17' is performed. Likewise, as a result, in each of the toner images of the other colors (magenta, cyan and black) are formed on the same paper 16.

The paper 16, with the color toner image formed on it by the four printing units 17', is transferred to the fixing unit 19 by the conveying belt 18 to be fixed and then is removed out of the LED printer via the outlet port 20 as color-printed paper.

Figure 10:
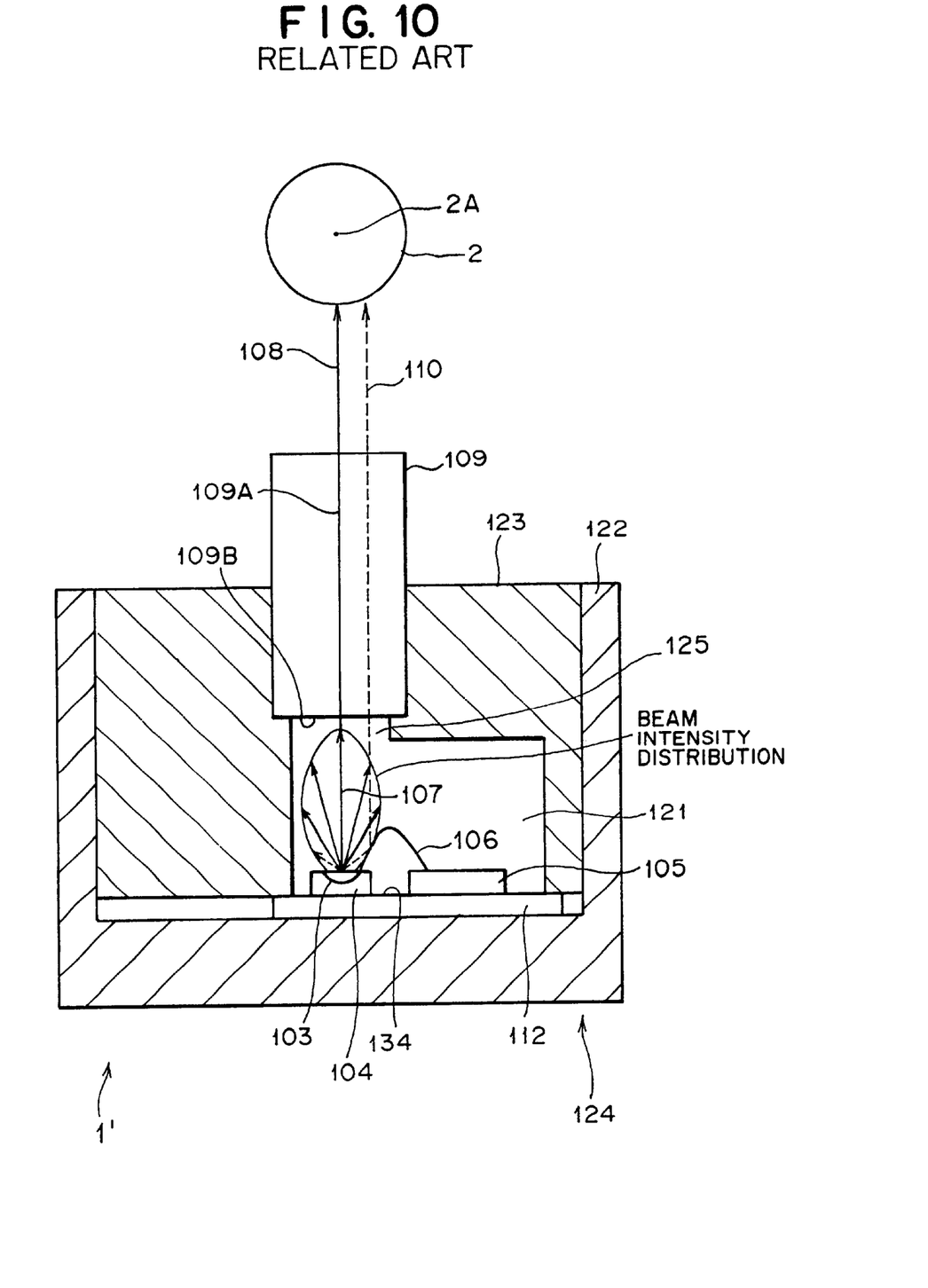
FIG. 10 is a cross-sectional view schematically showing an exposure device that is applied to the LED printer of the related art.

FIG. 10 schematically shows a cross-sectional view of an exposure device which is applied to the LED printer of the related art. An exposure device 1' of FIG. 10 is installed in the exposure unit 27' (FIG. 9) and has an exposure body 124 and an image forming lens 109. The exposure body 124 is composed of an outer casing 122 and an inner casing 123, which are generally C-shaped in cross section, the inner casing 123 being telescopically fitted in the outer casing 122 with their through-hole side facing each other to define a light-emitting space 121 inside the exposure body 124.

On the bottom wall of the light-emitting space 121 (hereinafter called the light-emitting-space bottom wall 134), a print board 112 is disposed on which a plurality of sets of light emitting diode microchips (hereinafter called the LED microchips 104) and driver elements 105 are arranged in array in series perpendicularly to the drawing sheet of FIG. 10.

The LED microchips 104 is circuits on which a plurality of light emitting diodes are mounted, and the driver elements 105 are driver circuits to energize the associated LED array 103. The LED microchip 104 and the driver element 105 of each set are electrically interconnected via an upwardly arcuate wires 106. Each light emitting diode of the LED microchip 104 is connected to a corresponding driver element 105.

The wires 106 connect the LED microchips 104 and the driver elements 105 with or without a wire ball. The wire-ball-free connection is technically more difficult than the with-wire-ball connection.

A through-hole 125 is disposed above the LED microchip 104 in the light emitting space 121, in which an image forming lens 109 is mounted in such a posture that the center line 109A of the image forming lens 109 coincides with the center of beam intensity distribution outputs (hereinafter called the intensity-distribution-center line 107) of the LED microchip 4.

The rotation center 2A of the photosensitive drum 2 is disposed on the upward extension of the center line 109A of the image forming lens 109. The beam output from the LED array 103, through the image forming lens 109, strikes the circumference of the photosensitive drum 2 to form a latent image on it.

However, in the exposure device 1', a local beam emitted from the LED array 103 reflects on the wires 106 (hereinafter, the beam reflects on the wire 106 is called the stray light 110), which connect the LED microchips 104 and the driver elements 105, and then tends to enter the image forming lens 109 since the beam-intensity-distribution center line 107 coincides with the center line 109A of the image forming lens 109.

The stray light 110, as well as local part of the beam directly strikes the incidence surface 109B of the image forming lens 109 output from the LED array 103 (hereinafter called the proper beam 108), strikes the incidence surface 109B of the image forming lens 109. As a result, the stray light 110 forms an undesired latent image on the circumferential surface of the photosensitive drum 2 and becomes one cause for deterioration of the quality of a printed image.

SUMMARY OF THE INVENTION

With the foregoing problems in view, it is an object of the present invention to provide an exposure device and an image forming apparatus in which a more vivid printed image can be formed as possible stray light is prevented from the striking image supporting body.

According to a first concept of the present invention, there is provided an exposure device comprising: a driver element; a light emitting diode microchip connected to the driver element by wires and having a light emitting diode array for outputting light for exposure; and an image forming lens for directing the light output from the light emitting diode array of the light emitting microchip onto an image supporting body as exposure light; the image forming lens being disposed in such a posture that the center line of the image forming lens is out of axial alignment with the center line of intensity distribution of the light output from the light emitting diode array on an incidence surface of the image forming lens so as to reduce possible incidence of stray light when local part of the light output from the light emitting diode array reflects on the wires.

As a preferable feature of the first concept, the image forming lens may be disposed off the center line of intensity distribution of the light output of the light emitting diode array.

As another preferable feature, the image forming lens may extend parallel to the center line of intensity of distribution of the light output of the light emitting diode array, or be inclined with respect to the center line of intensity distribution of the light output of the light emitting diode array.

According to a second concept of the present invention, there is provided an exposure device comprising: a driver element; a light emitting diode microchip connected to the driver element by wires and having a light emitting diode array for outputting light for exposure; and an image forming lens for directing the light output from the light emitting diode array of the light emitting diode microchip onto an image supporting body as exposure light; the image forming lens being disposed in such an inclined posture that a first imaginary plane perpendicular to an incidence surface of the image forming lens crosses a second imaginary plane perpendicular to a light emitting surface of the light emitting diode array on the light emitting surface of the light emitting diode array so as to reduce possible incidence of stray light when local part of the light output from the light emitting diode array reflects on the wires.

As a preferable feature of the second concept, the center line of the image forming lens may be disposed, toward a wire-free side of the light emitting diode microchip, off the center line of intensity distribution of the light output of the light emitting diode array.

As another feature, the individual wire connecting between the light emitting diode microchip and the driver element has a wire ball at at least one end, the center line of the image forming lens being disposed, toward a wire-ball side of the light emitting diode microchip, off the center line of intensity distribution of the light output of the light emitting diode array.

According to a third concept of the present invention, there is provided an image forming machine comprising: an image supporting body to be charged with electricity; an exposure device for exposing the image supporting body, which is charged with electricity, to light to form a latent image on the image supporting body in terms of a pattern of areas left undischarged; a developing unit for applying a developer to the image supporting body, which is charged with electricity and is exposed to the light by the exposure device, so that the developer adheres only to the undischarged areas to bring the latent image into a visible image of the developer; and a transferring unit for transferring the developer of the visible image from the image supporting body onto a medium; the exposure device including: a driver element, a light emitting diode microchip connected to the driver element by wires and having a light emitting diode array for outputting light for exposure, and an image forming lens for directing the light output from the light emitting element array of the light emitting microchip onto the image supporting body as exposure light, the image forming lens being disposed in such a posture that the center line of the image forming lens is out of axial alignment with the center line of intensity distribution of the light output from the light emitting array on an incidence surface of the image forming lens so as to reduce possible incidence of stray light when local part of the light output from the light emitting diode array reflects on the wires.

According to a fourth concept of the present invention, there is provided an image forming machine comprising: an image supporting body to be charged with electricity; an exposure device for exposing the image supporting body, which is charged with electricity, to light to form a latent image on the image supporting body in terms of a pattern of areas left undischarged; a developing unit for applying a developer to the image supporting body, which is charged with electricity and is exposed to the light by the exposure device, so that the developer adheres only to the undischarged areas to bring the latent image into a visible image of the developer; and a transferring unit for transferring the developer of the visible image from the image supporting body onto a medium; the exposure device including: a driver element; a light emitting diode microchip connected to the driver element by wires and having a light emitting diode array for outputting light for exposure, and an image forming lens for directing the light output from the light emitting element array of the light emitting microchip onto the image supporting body as exposure light, the image forming lens being disposed in such an inclined posture that a first imaginary plane perpendicular to an incidence surface of the image forming lens crosses a second plane perpendicular to a light emitting surface of the light emitting diode array on the light emitting surface of the light emitting diode array so as to reduce possible incidence of stray light when local part of the light output from the light emitting diode array reflects on the wires.

Accordingly, in the exposure device and the image forming apparatus of the present invention, the center line of the image forming lens is out of axial alignment with the center line of intensity distribution of the light output from the light emitting diode array on an incidence surface of the image forming lens so as to reduce possible incidence of stray light when local part of the light output from the light emitting diode array reflects on the wires. As an advantageous result, the quality of printed image is improved.

Further, the center line of the image forming lens can be inclined with respect to the center line of intensity distribution of the light output of the light emitting diode array. As another advantageous result, more amount of beam enters the image forming lens 9 and the exposure light is uprated.

The image forming lens can be disposed in such an inclined posture that a first imaginary plane perpendicular to an incidence surface of the image forming lens crosses a second imaginary plane perpendicular to a light-emitting surface of the light emitting diode array on the light-emitting surface of the light emitting diode array so as to reduce possible incidence of stray light when local part of the light output from the light emitting diode array reflects on the wires. As still another advantageous result, the exposure light is uprated since an increased amount of exposure light enters the incidence surface of the image forming lens, and an more vivid image is created since the exposure light output from light emitting diode array enters the image forming lens parallel to the center line of image forming lens preventing the exposure light from deteriorating.

DESCRIPTION OF THE PREFFERED EMBODIMENTS

Various preferred embodiments of the present invention will now be described with reference to the accompanying drawings.

(A) Description of First Embodiment

Figure 1:
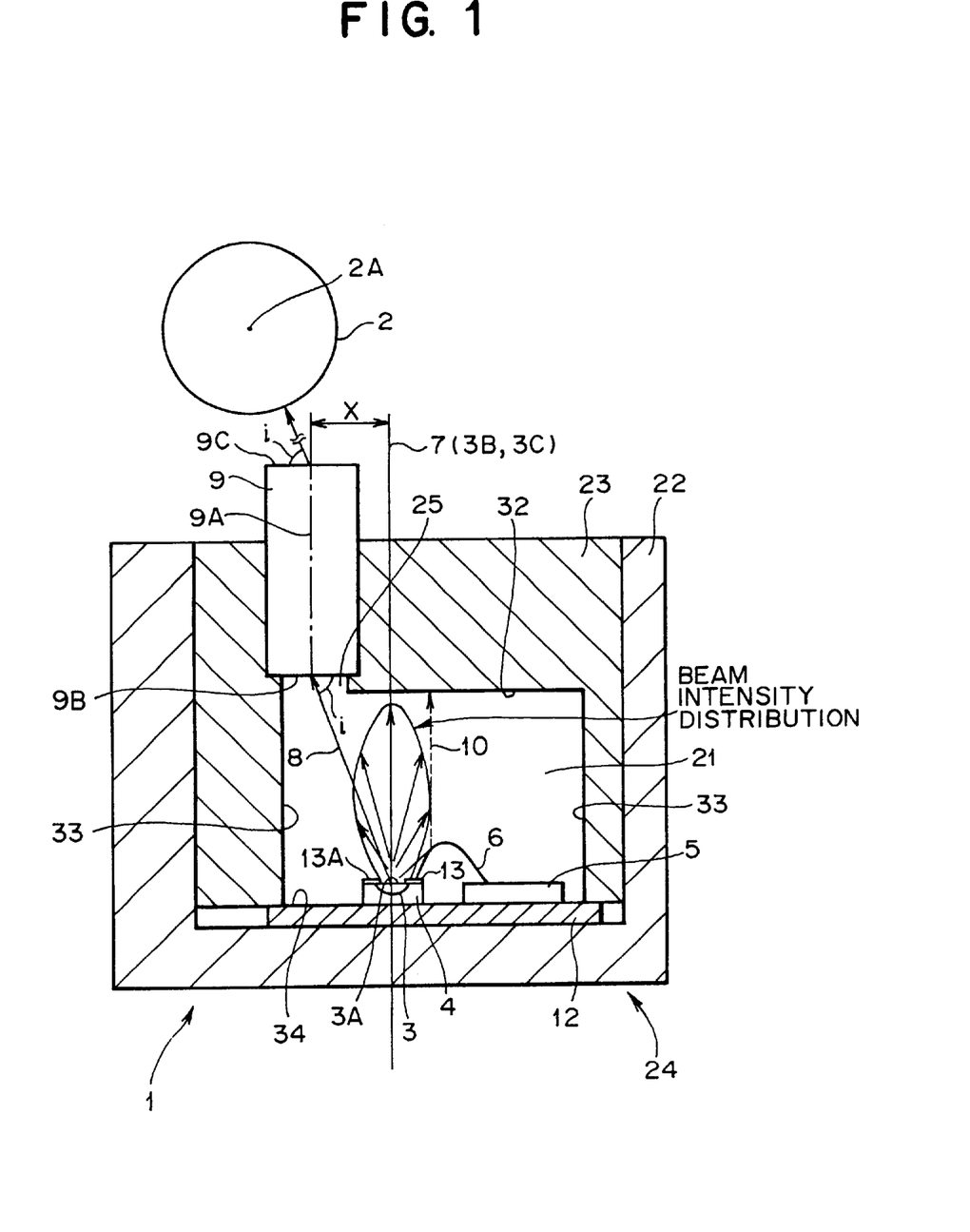
FIG. 1 is a cross-sectional view schematically showing an exposure device according to a first embodiment of the present invention.
Figure 2:
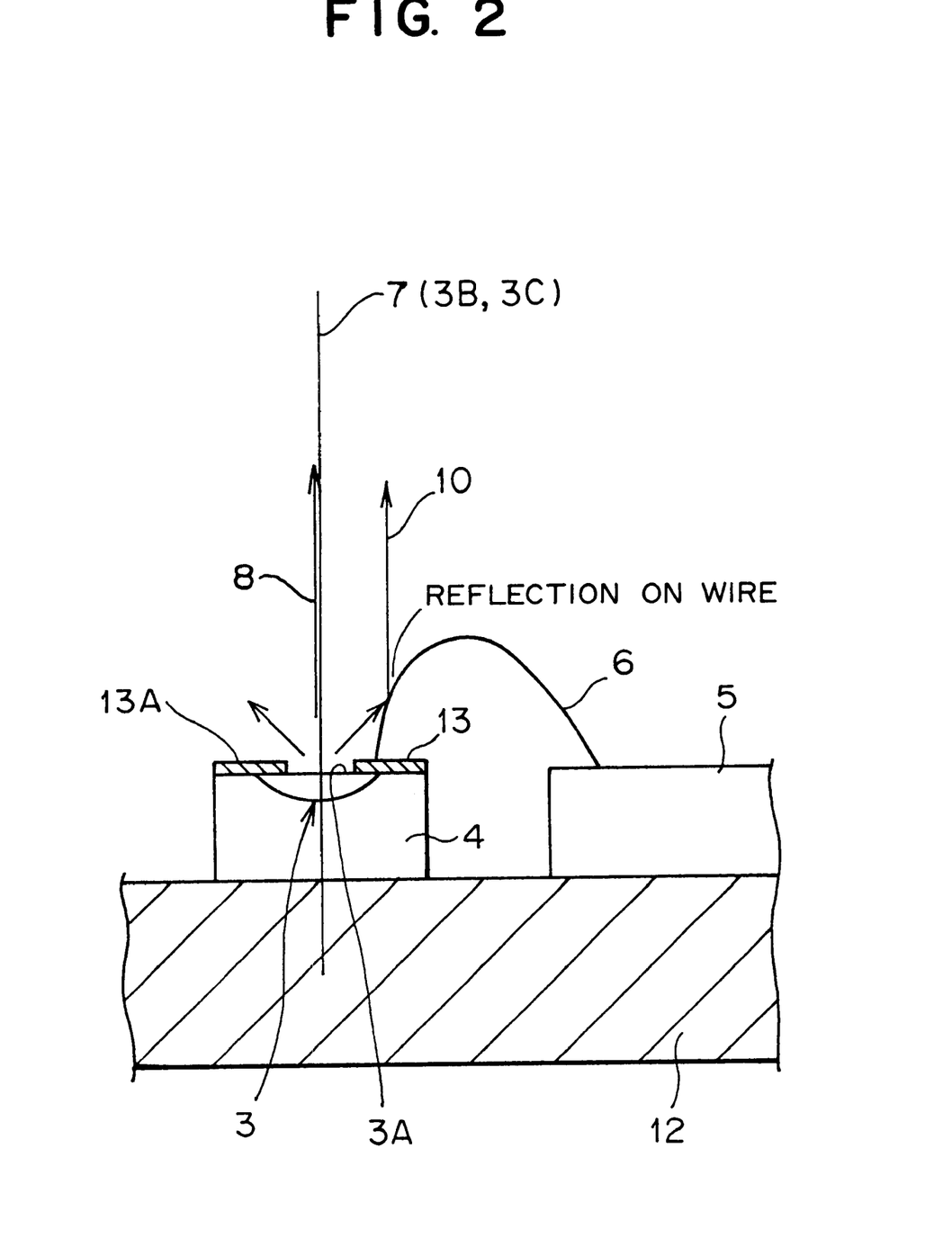
FIG. 2 is a fragmentary, enlarged cross-sectional view schematically showing an LED array of the exposure device of the first embodiment.
Figure 3:
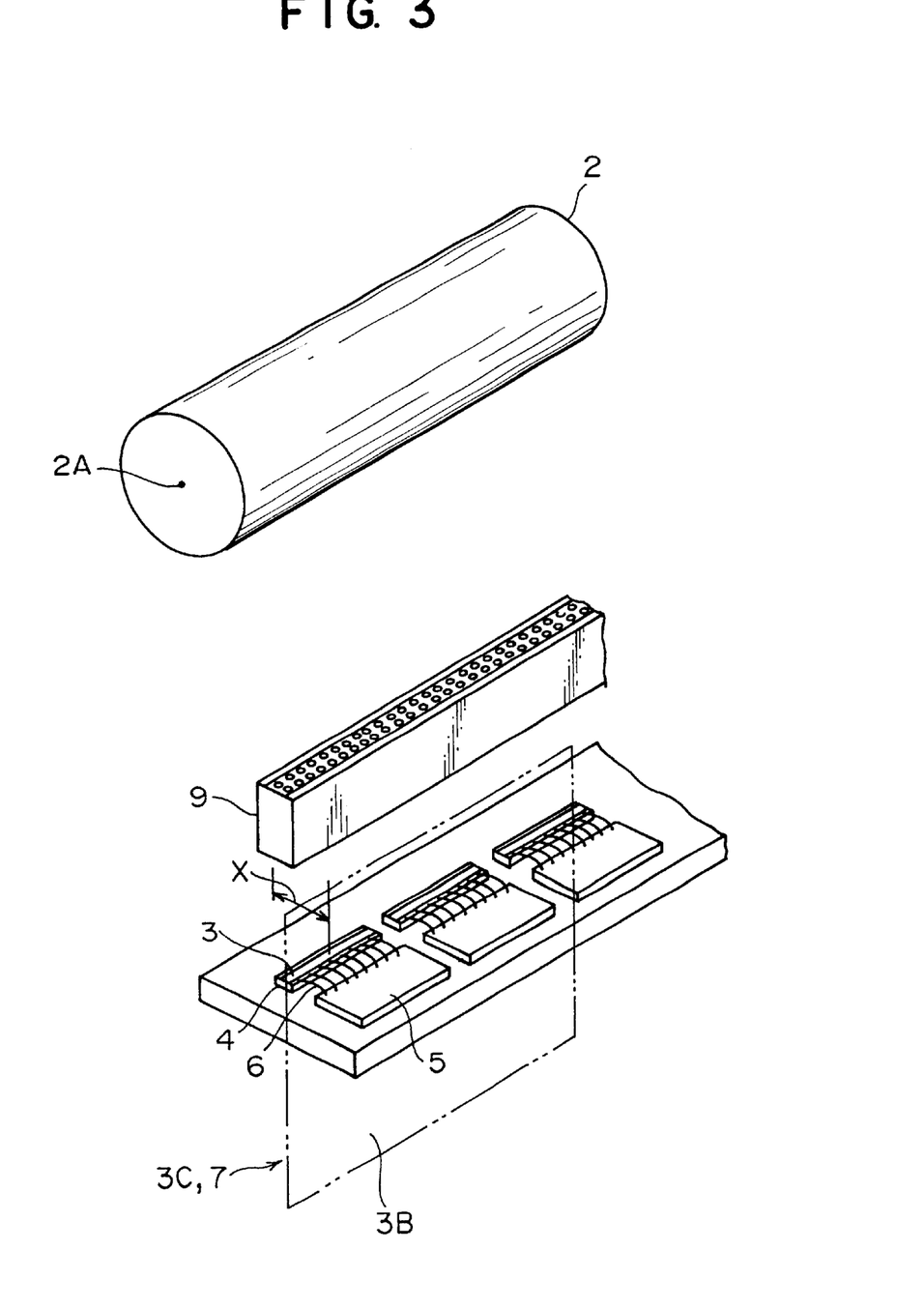
FIG. 3 is a fragmentary, exploded perspective view of the exposure device of the first embodiment, illustrating relative positions of a print board, an image forming lens and a photosensitive drum of the exposure device of the first embodiment.
Figure 4:
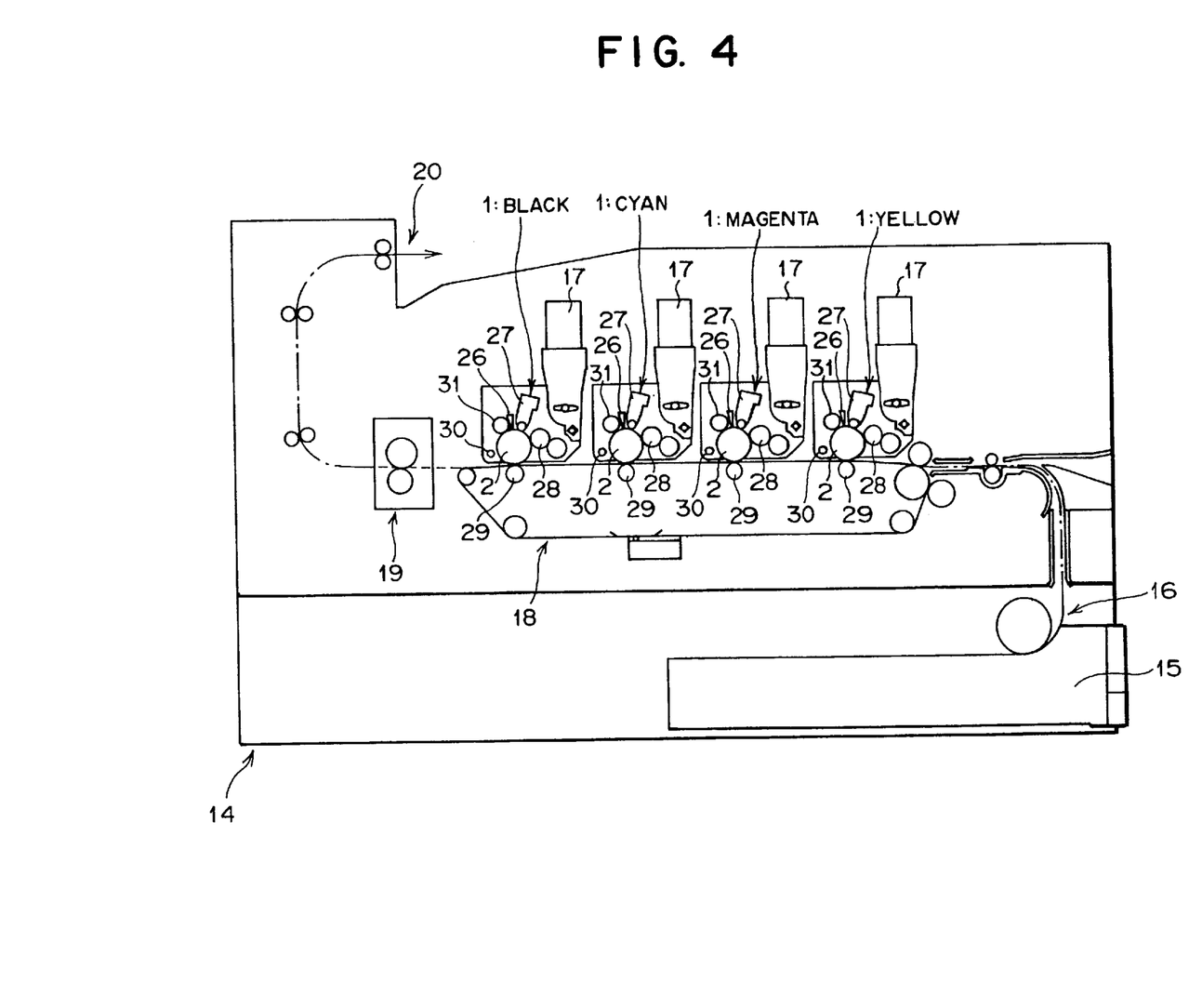
FIG. 4 is a side elevation view schematically showing an LED printer to which the exposure device of the first embodiment is applied.

FIGS. 1 through 4 show an exposure device according to a first embodiment of the present invention; FIG. 1 is a cross-sectional view schematically showing the exposure device, FIG. 2 is a fragmentary, enlarged cross-sectional view showing an LED array of the exposure device, FIG. 3 is a fragmentary, exploded perspective view of illustrating relative positions of a print board, an image forming lens and a photosensitive drum, and FIG. 4 is a side elevational view schematically showing an LED printer.

An LED printer 14 is equipped with an exposure device generally comprises, as shown in FIG. 4, a paper cassette 15, four printing units 17, a conveying belt 18, a fixing unit 19, and an outlet port 20.

The LED printer 14 prints a color image on paper (medium) 16 using toners of four colors, yellow, magenta, cyan and black, and includes four printing units 17, which are substantially identical in construction, one for each of the four colors, and are arranged in series along the travelling path of the paper 16.

Each printing unit 17 forms a toner image on the paper 16, including a photosensitive drum 2, a charging unit 26, an exposure unit 27, a developing unit 28, a transferring unit 29, a discharging unit 30 and a cleaning unit 31.

The photosensitive drum (image supporting body) 2 of the individual printing unit 17 is disposed so as to extend perpendicularly across the traveling path of the paper 16. The charging unit 26, the exposure unit 27, the developing unit 28, the transferring unit 29, the discharging unit 30 and the cleaning unit 31 are arranged on and around the circumference of the photosensitive drum 2 for performing the respective functions while the photosensitive drum 2 makes a single rotation.

The paper cassette 15 holds the paper 16 to supply and delivers it to the printing units 17 as a demand arises, and the conveying belt 18 conveys the paper 16 to the individual printing units 17.

The fixing unit 19 fixes a toner image formed in the printing units 17, and the outlet port 20 allows the paper 16, which has been printed in color, to be removed out of the LED printer 14.

Color-printing is performed on the LED printer 14 in the following manner. The paper cassette 15 delivers one sheet of the paper 16 at a time onto the conveying belt 18. The conveying belt 18 then bring the paper 16 to the printing units 17 where the individual printing units 17 sequentially form toner images of colors of yellow, magenta, cyan and black.

In the individual printing unit 17, the charging unit 26 electrically charges the circumferential surface of the photosensitive drum 2 uniformly. Then the exposure unit 27 forms an electrostatic latent image on the circumferential surface of the photosensitive drum 2 in accordance with an original image to be printed. Then the developing unit 28 develops the latent image with toner, bringing the latent image into a visible image of the toner. After that the transferring unit 29 transfers the toner of the visible image to the paper 16, at which time the toner image on the paper 16 is not fixed yet.

After the toner image is transferred to the paper 16, the discharging unit 30 discharges the circumferential surface of the photosensitive drum 2, whereupon the cleaning unit 31 removes residual toner.

Subsequently in the first printing unit 17, the paper 16 to which toner image of the first primary color (yellow) transferred by the transferring unit 29 is conveyed to the second printing unit 17 on the conveying belt 18. Then in the second printing unit 17, third and fourth printing units 17, toner image in the same printing process as in the first printing unit 17 is performed. Likewise, as a result, the toner images of the other colors (magenta, cyan and black) are formed on the same paper 16.

The paper 16, with the color toner image formed on it by the four printing units 17, is transferred to the fixing unit 19 by the conveying belt 18 to be fixed and then is removed out of the LED printer 14 via the outlet port 20 as color-printed paper.

The exposure device 1 of the first embodiment irradiates exposure light to the photosensitive drum 2, which is charged with electricity by the charging unit 26, to form an electrostatic latent image on the photosensitive drum 2 in terms of a pattern of electric charges left undischarged. The exposure device 1 is installed in the exposure unit 27 (FIG.

4) and is composed of an exposure body 24 and a image forming lens 9, as shown in FIG. 1.

The exposure body 24 is composed of an outer casing 22 and an inner casing 23, which are generally C-shaped in cross section the inner casing 23 being telescopically fitted in the outer casing 22 with their through-hole sides facing each other. With this arrangement, a light-emitting space 21 is defined inside the exposure body 24 as surrounded by a top wall (hereinafter called the light-emitting-space top wall 32), a side wall (hereinafter called the light-emitting-space side wall 33) and a bottom wall (hereinafter called the light-emitting-space bottom wall 34).

As shown in FIG. 3, on the light-emitting-space bottom wall 34, a print board 12 is disposed on which a plurality of sets of LED (light emitting diode) microchips 4 and driver elements 5 are arranged in array parallel to the axis of rotation of the photosensitive drum 2 (in a direction perpendicular to the drawing sheet of FIG. 1). As shown in FIG. 2, the LED microchip 4 and the driver element 5 of each set are electrically interconnected via an upwardly arcuate wires 6.

A plurality of LEDs are arranged on a single LED microchip 4 to form an LED array 3, which outputs exposure light.

Each LED array 3 outputs exposure light perpendicularly from its light-emitting surface (hereinafter called the light-emitting surface 3A of the LED array 3) in such an intensity distribution that the peak of the light output appears on the perpendicular plane 3B of the LED array 3 (FIG.3) parallel to the line of arrangement of the LED microchips 4. The center line of intensity distribution of the light output of the light emitting diodes (hereinafter called the beam-intensity-distribution center line 7) coincides with the perpendicular plane 3B of the LED array 3.

Each driver element 5 is a driver circuit which energizes the associated LED array 3 to emit exposure light, including a circuit for transmitting data for that purpose.

The individual LEDs of each the LED microchip 4 are electrically connected to the corresponding driver element 5 via the respective wires 6 with a mask 13 (FIG. 2) interposed. The mask 13 is mounted on the surface of the LED array 3, serving as a contact of the LED on the LED microchip 4 and also as a limiter to restrict the exposure area of the light beam output from the LED array 3.

In the first embodiment, as shown in FIG. 2, the LED microchip 4 and driver element 5 of each set are electrically interconnected via the wires 6 each being connected one end to the mask 13 on the surface of the LED microchip 4 and at the other end to the driver element 5, in a wire-ball-free way.

The image forming lens 9 directs the exposure light output from the LED array 3 of the LED microchip 4 to the circumferential of the photosensitive drum 2 to form a latent image on it and is composed of a multiplicity of self-converging glass fibers, such as rod lenses, a single lens unit exemplified a cellfock lens as is known in the art.

The image forming lens 9 is mounted in a through-hole 25 (FIG. 1) in a way that the center line of the image forming lens 9A is disposed, off the beam-intensity-distribution center line 7 (the center line of intensity distribution the light output) of the LED microchip 4, which is installed on the print board 12 on the light emitting-space bottom wall 34, by a predetermined distance x toward the wire-free side of the light emitting diode microchip 4 (left side in FIG. 1), preventing possible of stray light 10, which originates from local light part of the light output on the wires 6, from entering the image forming lens 9. Specifically, the image forming lens 9 is installed in a way that center line 9A of the image forming lens 9 extends parallel to the beam-intensity-distribution center line 7 of the LED array 3.

Thus, the center line 9A of the image forming lens 9 is parallel to the beam-intensity-distribution center line 7 at the LED array 3 so as to reduce possible incidence of stray light 10 originating from local light part reflected on the wires 6.

In the exposure device 1 of FIG. 1, the rotation center 2A of the photosensitive drum 2 is disposed off the extension of the center line 9A of the image forming lens 9 in such a way that the photosensitive drum 2 confronts the LED microchip 4 with the image forming lens 9 interposed.

The through-hole 25 is designed in a way that the possible stray light 10 due to the reflection of light on the wires 6 does not enter the incidence surface 9B of the image forming lens 9.

In the thus constructed exposure device 1 of the first embodiment, control data for controlling the LED array 3 to emit exposure light, based on image data from a non-illustrated high-rank device, such as a host computer is transmitted to the driver device 5.

A beam emitted from the light-emitting surface 3A of the LED array 3, as shown in FIG. 2, diffuses radially. Part of the diffused beam directly enters the incidence surface 9B of the image forming lens 9, being hereinafter called a proper beam 8.

Some local part of the beam other than the proper beam 8 becomes stray light 10 when reflected on the wires 6.

The proper beam 8, as shown in FIG. 1, enters the incidence surface 9B of the image forming lens 9, which is disposed off the beam-intensity-distribution center line 7 by a predetermined distance x toward a wire-free side of the light emitting diode microchip 4, at a predetermined incidence angle i; subsequently it proceeds through the image forming lens 9 and then goes out from the exit surface 9C of the image forming lens 9 at a predetermined exit angle i, and finally strikes the circumferential surface of the photosensitive drum 2 to form a latent image on it.

Meanwhile, the stray light 10 strikes the top wall 32 of the light emitting space 21 but does not enter the incidence surface 9B of the image forming lens 9 directly.

In the exposure device 1 of the first embodiment, since the stray light 10 does not enter the image forming lens 9 directly, and a latent image on the photosensitive drum 2 is formed only by the proper beam 8, improving the quality of a printed image.

(B) Modification of First Embodiment

Figure 5:
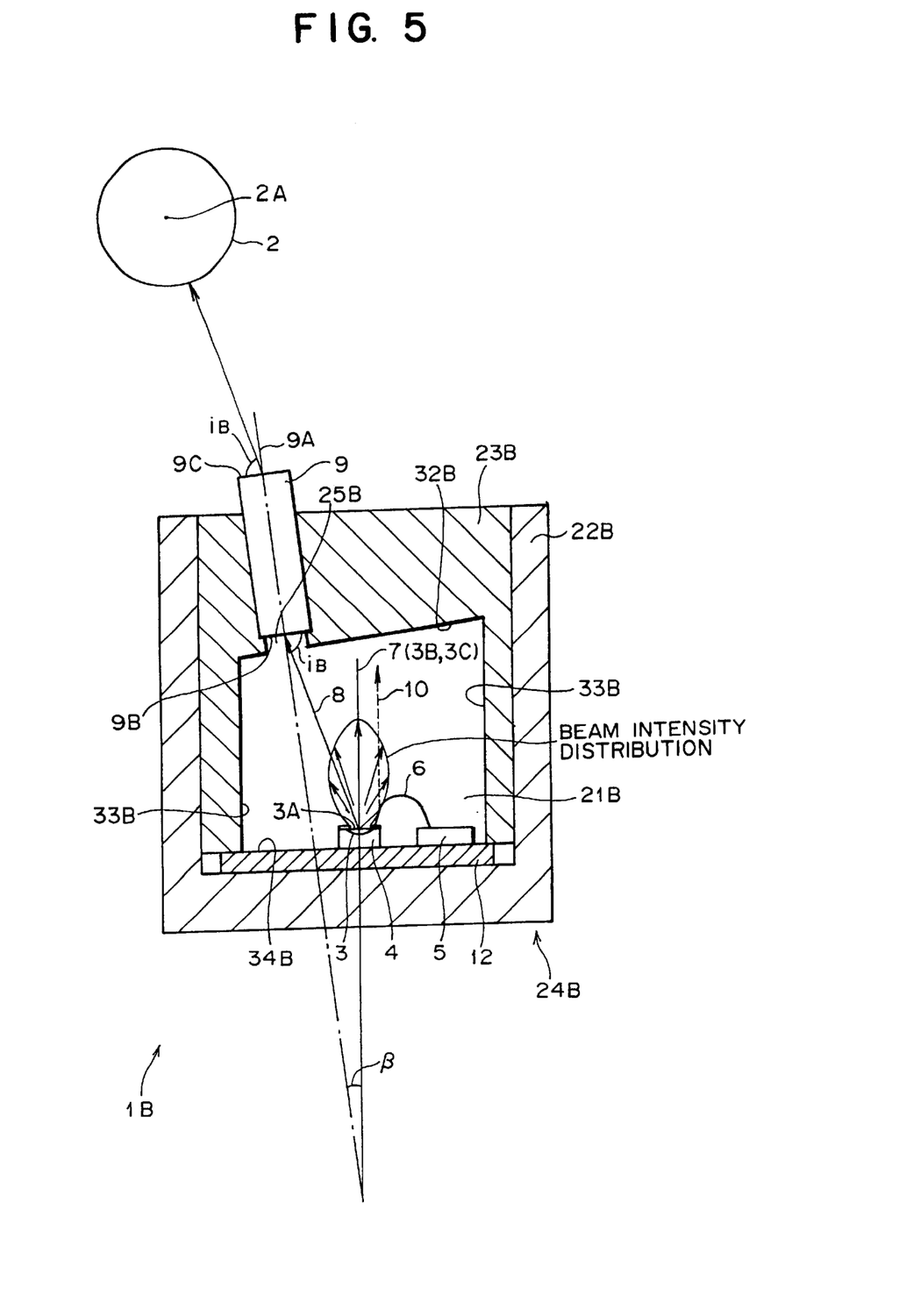
FIG. 5 is a cross-sectional view similar to FIG. 1, but showing a modification of the exposure device of the first embodiment.

FIG. 5 shows a cross-sectional view showing a modification of the exposure device 1 of the first embodiment. This modified exposure device 1B comprises an exposure body 24B, which is a substitute for the exposure body 24 of the first embodiment.

Like reference numbers designate similar parts or elements throughout several views of different illustrated examples, so any repetitious description is omitted here.

The exposure body 24B, as shown in FIG. 5, is composed of an outer casing 22B and an inner casing 23B, which are generally C-shaped in cross section, the inner casing 23B being telescopically fitted in the outer casing 22B with their through-hole sides facing each other. As a significant feature, the inner casing 23B has a non-uniform-thickness horizontal wall increasing gradually from one side to the other. With this arrangement, a light-emitting space 21B is defined inside the exposure body 24B as surrounded by a top wall (hereinafter called the light-emitting-space top wall 32B), a side wall (hereinafter called the light-emitting-space side wall 33B) and a bottom wall (hereinafter called the light-emitting-space bottom wall 34B).

The image forming lens 9. as shown in FIG. 5, is mounted in a through-hole 25B in a way that the center line 9A of the image forming lens 9 is disposed off the beam-intensity-distribution-distribution center line 7 of the LED microchip 4 on the print board 12, which is installed on the light emitting-space bottom wall 34B, toward the wire-free side of the connection between the LED microchip 4 and the driver element 5 so that the center line 9A of the image forming lens 9 is out of axial alignment with the beam-intensity-distribution center line 7. The center line 9A of the image forming lens 9 is inclined with respect to the beam-intensity-distribution center line 7 at a predetermined angle B (inclined status) so that the incidence 9B surface of the image forming lens 9 confronts with the LED array 3.

Thus, the image forming lens 9 is disposed in such a posture that the center line 9A of the image forming lens 9 is out of axial alignment with the beam-intensity-distribution center line 7 (the center line of intensity of distribution of the light output) of the LED array 3 on the incidence surface 9B of the image forming lens 9 so as to reduce possible incidence of stray light 10 originating from local part of light reflected on the wires 6.

The proper beam 8 emitted from the beam intensity distribution 7 of the light-emitting surface 3A of the LED array 3 to the center line 9A at the incidence surface 9B of the image forming lens 9 enters the incidence surface 9B of the image forming lens 9 at a predetermined incidence angle iB, and in the exposure device 1B, the rotation center 2A of the photosensitive drum 2 is disposed off the extension of the center line 9A of the image forming lens 9 so that the beam exits from the center line 9A on the exit surface 9C of the image forming lens 9 at an exit angle iB perpendicularly strikes the circumferential surface of the photosensitive drum 2.

In the exposure device 1B, both the rotation center 2A of the photosensitive drum 2 and the LED array 3 are disposed off the extension of the center line 9A of the image forming lens 9 in such a way that the photosensitive drum 2 confronts the LED microchip 4 with the image forming lens 9 interposed.

Further, the through-hole 25B is designed in a way that the possible stray light 10 due to the reflection of light on the wires 6 does not enter the incidence surface 9B of the image forming lens 9.

In the exposure device 1B, as a modification of the first embodiment, a beam emitted from the light-emitting surface 3A of the LED array 3 diffuses radially. Part of the beam then enters the incidence surface 9B of the image forming lens 9 at the incidence angle iB as a proper beam 8. Subsequently the beam proceeds through the image forming lens 9 and then goes out from the exit surface 9C of the image forming lens 9 at a predetermined exit angle iB. Finally the beam strikes the circumferential surface of the photosensitive drum 2 to form a latent image on it likewise the exposure device 1 of the first embodiment.

Meanwhile, the stray light 10 strikes the top wall 32B of the light emitting space 21B but does not enter the incidence surface 9B of the image forming lens 9 directly.

The modified exposure device 1B, ensures the same result as the exposure device 1 and enables an increased amount of beam to enter the image forming lens 9, uprating exposure light, since the center line of the image forming lens 9A is inclined with respect to the beam-intensity-distribution center line 7 at a predetermined angle B in a way that the incidence surface 9B of the image forming lens 9 confronts the LED array 3.

(C) Description of Second Embodiment

Figure 6:
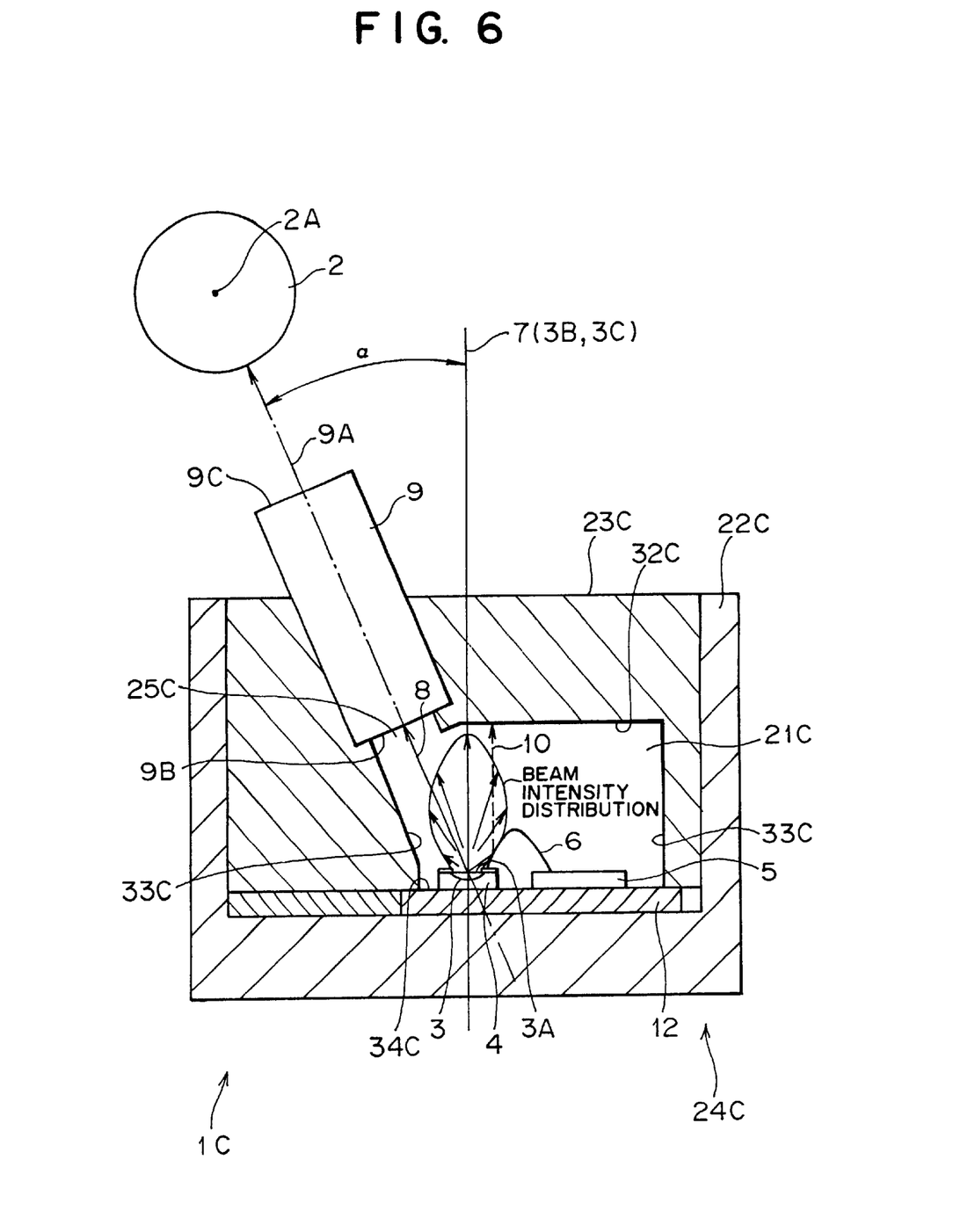
FIG. 6 is a cross-sectional view schematically showing another exposure device according to a second embodiment of the present invention.

FIG. 6 shows a cross-sectional view schematically showing another exposure device according to a second embodiment of the present invention. The exposure device 1C of the second embodiment comprises an exposure body 24C, which is a substitute for the exposure body 24 of the first embodiment.

Like reference numbers designate similar parts or elements throughout several views of different illustrated examples, so any repetitious description is omitted here.

The exposure body 24C, as shown in FIG. 6, is composed of an outer casing 22C and an inner casing 23C, which are generally C-shaped in cross section, the inner casing 23C being telescopically fitted in the outer casing 22B with their through-hole sides facing each other. As a significant feature, the inner casing 23C has a non-uniform-thickness side wall inclined with respect to the bottom. With this arrangement, a light-emitting space 21C is defined inside the exposure body 24C as surrounded by a top wall (hereinafter called the light-emitting-space top wall 32C), a side wall (hereinafter called the light-emitting-space side wall 33C) and a bottom wall (hereinafter called the light-emitting-space bottom wall 34C).

In the exposure device 1C, the image forming lens 9 is inclined such in a posture that the center line 9A of the image forming lens 9, which is a first imaginary plane perpendicular to an incidence surface 9B of said image forming lens 9, crosses the perpendicular plane 3B of the LED array 3, which is a second imaginary plane perpendicular to the light-emitting surface 3A, on the LED array light-emitting surface 3A, so as to reduce possible incidence of stray light 10 originating from local light part reflected on the wires 6.

Specifically, the image forming lens 9 is mounted in the through-hole 25C in a way that the center line 9A of the image forming lens 9 is inclined with respect to the beam-intensity-distribution center line 7 of the LED microchip 4 on the print board 12, which installed on the light-emitting-space bottom wall 34C, by an angle α toward the wire-free side of the LED microchip 4 (leftward in FIG. 6) so that the beam-intensity-distribution center line 7 crosses the center line 9A of the image forming lens 9 at the LED array light-emitting surface 3A.

The light-emitting-space side face 33C is substantially parallel to the center line 9A of the image forming lens 9.

In the exposure device 1C of the second embodiment, the rotation center 2A of photosensitive drum 2, as shown in FIG. 6, is disposed on the extension of the center line 9A of the image forming lens 9.

Thus, both the rotation center 2A of the photosensitive drum 2 and the LED array 3 are disposed on the extension of the center line 9A of the image forming lens 9 in such a way that the photosensitive drum 2 confronts with the LED array 3 with the image forming lens 9 interposed.

Further, the through-hole 25C is designed in a way that the possible stray light 10 due to the reflection of light on the wires 6 does not enter the incidence surface 9B of the image forming lens 9.

In the exposure device 1C of the second embodiment, as shown in FIG. 6, a beam emitted from the light-emitting surface 3A of the LED array 3 diffuses radially. Part of the beam then enters the incidence surface 9B of the image forming lens 9 perpendicularly as a proper beam 8. Subsequently the beam proceeds through the image forming lens 9 and then goes out from the exit surface 9C of the image forming lens 9 perpendicularly. Finally the beam strikes the circumferential surface of the photosensitive drum 2 to form a latent image on it.

Meanwhile, the stray light 10 strikes the top wall 32C of the light emitting space 21C but does not enter the incidence surface 9B of the image forming lens 9 directly.

The exposure device 1C of the second embodiment ensures the same results as the exposure devices 1, 1B, and the light output from the LED array 3 perpendicularly enters the incidence surface 9B of the image forming lens 9 preventing beam proceed through the image forming lens 9 from deteriorating. The quality of a printing image is thus improved.

(D) Description of Third Embodiment

Figure 7:
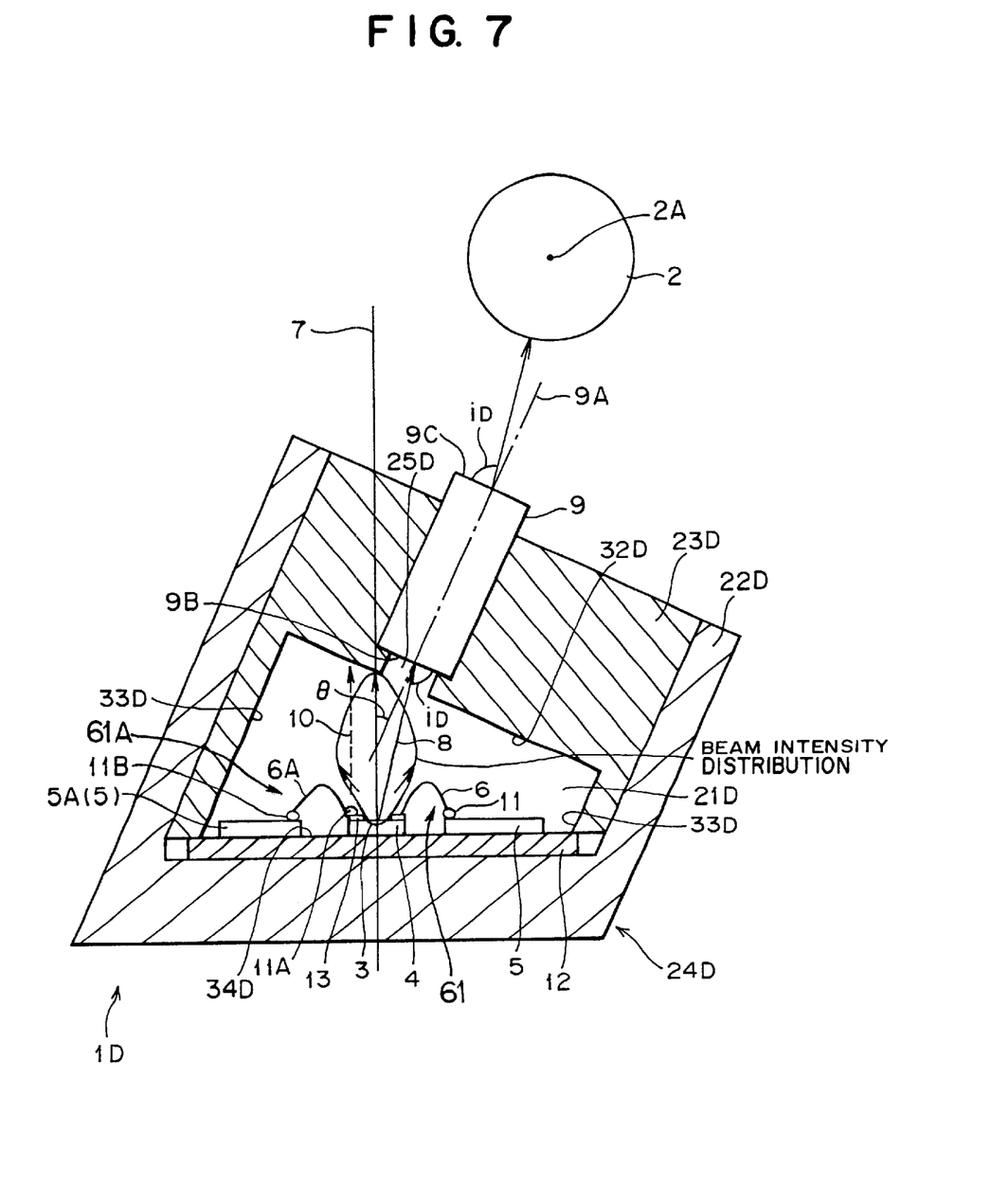
FIG. 7 is a cross-sectional view schematically showing still another exposure device according to a third embodiment of the present invention.

FIG. 7 shows a cross-sectional view schematically showing another exposure device according to a third embodiment of the present invention. The exposure device 1D of the third embodiment comprises an exposure body 24D, which is a substitute for the exposure body 24 of the first embodiment.

Like reference numbers designate similar parts or elements throughout several views of different illustrated examples, so any repetitious description is omitted here.

In the third embodiment, a plurality of driver elements 5 are disposed on both side of the LED array 4 on the print board 12 in series parallel to the LED array 4, and the LED array 4 and the associated driver elements 5 of each set are interconnected via wires 61 with wire balls.

The individual wire 61 has a wire ball 11 at at least one end. The driver element 5, on the right side of the LED microchip 4 in FIG. 7 is connected to the mask 13 on the surface of the LED array 4. The mask 13 is connected to the wire 61 directly in a wire-ball-free connection, and the driver element 5 is connected to the wire 61 via the wire ball 11.

Otherwise, the wire 61 with a wire ball connects the other driver element 5, on the left side of the LED microchip 4 in FIG. 7, and the mask 13 on the surface of the LED array to each other. The wire 61 and the other driver elements 5 are interconnected via the respective wire ball.

For the convenience, signals 5A, 6A, and 61A are respectively dedicated to the driver elements disposed leftward of the LED microchips 4, the wires which connects the driver elements 5A and the LED array 3, and the wires 61 with a wire ball which connect the driver element 5A and the LED array 3 in the further description. Further, the wire balls which connect the wires 61A with a wire ball and the mask 13 on the LED array is dedicated to a signal 11A, and the wire balls which connect the wires 61A with a wire ball and the driver elements 5A is dedicated to a signal 11B.

The exposure body 24D is composed of an outer casing 22D and an inner casing 23D, which are generally C-shaped in cross section the inner casing 23D being telescopically fitted in the outer casing 22D with their through-hole side facing each other. As significant features, both side walls of the outer casing 22D are inclined with respect to the bottom toward one direction and the both side wall of the inner casing 23D are different in height from each other. With this arrangement, a light-emitting space 21D is defined inside the exposure body 24D as surrounded by a top wall (hereinafter called the light-emitting-space top wall 32D), a side wall (hereinafter called the light-emitting-space side wall 33D) and a bottom wall (hereinafter called the light-emitting-space bottom wall 34D).

In the light-emitting space 21D of FIG. 7, the light-emitting-space side wall 33D and the light-emitting-space top wall 32D are inclined toward the wire 61 with a wire ball (a wire-ball-free side of the light emitting diode microchip 4: right side in FIG. 7).

The image forming lens 9 is, as shown in FIG. 7, mounted in the through-hole 25D in such a posture that the center line 9A of the image forming lens 9 is inclined with respect to the beam-intensity-distribution center line 7 of the LED microchip 4 on the print board 12 on the light-emitting-space bottom wall 34D at an angle θ (inclined status) toward a wire-ball-free side, the side of the wire 61 with a wire ball (right side in FIG. 7).

Thus, the center line 9A of the image forming lens 9 (an imaginary plane perpendicular to the incidence surface of the image forming lens) is inclined at the incidence surface 9B of the image forming lens 9 with respect to the beam-intensity-distribution center line 7 (center of intensity distribution of light emitting output) of the LED array 3 toward wire-ball-free side of the LED microchip 4 at the predetermined angle θ (inclined status) so as to reduce possible incidence of stray light 10 originating from local light part reflected on the wire balls 11A.

The proper beam 8, which is output from the beam-intensity-distribution center line 7 of the light-emitting surface 3A of the LED array 3 to the center line 9A on the incidence surface 9B of the image forming lens 9, enters the incidence surface 9B of the image forming lens 9 at a predetermined incidence angle iD.

In the exposure device 1D, as shown in FIG. 7, the rotation center 2A of the photosensitive drum 2 is disposed off the center line 9A of the image forming lens 9 toward the opposite side of the LED microchip 4 in a way that the photosensitive drum 2 confronts the LED microchip 4 with the image forming lens 9 interposed and also in a way that a beam output from the center line 9A of the exit surface 9C of the image forming lens 9 at a predetermined exit angle iD perpendicularly strikes the circumferential surface of the photosensitive drum 2.

Further, the through-hole 25D is designed in a way that the possible stray light 10 due to the reflection of light. on the wire balls 11A does not enter the incidence surface 9B of the image forming lens 9.

In the exposure device 1D, as shown in FIG. 7, a beam output from the light-emitting surface 3A of the LED array 3 diffuses radially. Part of the beam enters the incidence surface 9B of the image forming lens 9 at the incidence angle iD as a proper beam 8. Subsequently the beam proceeds through the image forming lens 9 and then goes out from an exit surface 9C of the image forming lens 9 at a predetermined exit angle iD. Finally the beam strikes the circumferential surface of the photosensitive drum 2 to form a latent image on it.

Meanwhile, the stray light 10 strikes the top wall 32D of the light emitting space 21D but does not enter the incidence surface 9B of the image forming lens 9 directly.

In the exposure device 1D of the third embodiment, since the stray light 10 reflected on the wire balls 11A does not enter the image forming lens 9 directly, a latent image on the photosensitive drum 2 can be formed only by the proper beam 8, improving the quality of a printed image.

(E) Modification of Third Embodiment

Figure 8:
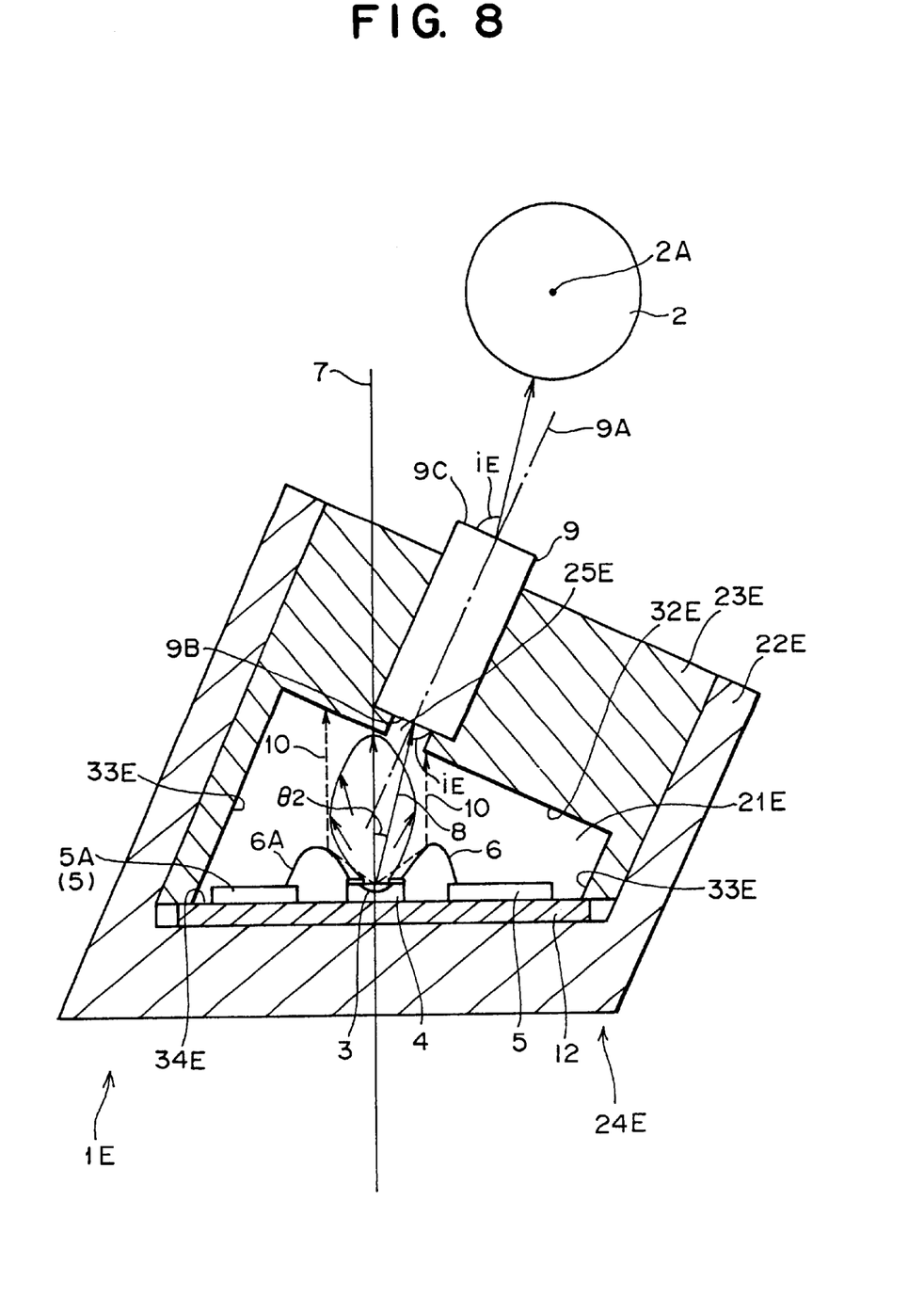
FIG. 8 is a cross-sectional view similar to FIG. 7, but showing a modification of the exposure device of the third embodiment.

FIG. 8 is a cross-sectional view similar to FIG. 7, but showing a modification of the exposure device of the third embodiment. This modified exposure device 1E comprises an exposure body 24E, which is a substitute for the exposure body 24D of the third embodiment. In this embodiment, the LED microchips 4 are directly connected to driver elements 5A, which are disposed the opposite sides of the LED microchips 4, via the wires 6 in a wire-ball-free way.

Like reference numbers designate similar parts or elements throughout several views of different illustrated examples, so any repetitious description is omitted here.

In this modified exposure device, a plurality of driver elements 5 (5A) are disposed, in series parallel to the LED microchip 4, both side of the LED microchip 4 on the print board 12, and the LED microchip 4 and the associated driver element 5 (5A) of each set are connected via the wires 6 (6A) in a wire-ball-free way.

The exposure body 24E is composed of an outer casing 22E and an inner casing 23E, which are generally C-shaped in cross section the inner casing 23E being telescopically fitted in the outer casing 22E with their through-hole sides facing each other. As significant features, both side walls of the outer casing 22E are inclined with respect to its bottom toward one direction and the both side wall of the inner casing 23E has a different heights each other. With this arrangement, a light-emitting space 21E is defined inside the exposure body 24E as surrounded by a top wall (hereinafter called the light-emitting-space top wall 32E), a side wall (hereinafter called the light-emitting-space side wall 33E) and a bottom wall (hereinafter called the light-emitting-space bottom wall 34E).

In the light-emitting space 21E of FIG. 8, the light-emitting-space side wall 33E and the light-emitting-space top wall 32E are inclined toward the wires 6 (right side in FIG. 8), respectively.

The image forming lens 9, as shown in FIG. 8, is mounted in the through-hole 25E in such a posture that the center line 9A of the image forming lens 9 is inclined with respect to the beam-intensity-distribution center line 7 of the LED microchip 4 on the print board 12, which is installed on the light-emitting-space bottom wall 34E, at an angle θ 2 (inclined status) toward the wires 6 (right side in FIG. 8).

The through-hole 25E is designed in a way that the possible stray light 10 due to the reflection of light on the wires 6 does not enter the incidence surface 9B of the image forming lens 9.

Thus, the center line 9A of the image forming lens 9 is inclined at the incidence surface 9B of the image forming lens 9 with respect to the beam-intensity-distribution center line (center of intensity distribution of light emitting output) 7 of the LED array 3 at the predetermined angle θ 2 (inclined status) toward the wires 6 so as to reduce possible incidence of stray light 10 originating from local part of light reflected on the wires 6, 6A.

The proper beam 8, which is output from the beam-intensity-distribution center line 7 of the light-emitting surface 3A of the LED array 3 to the center line 9A of the incidence surface 9B of the image forming lens 9, enters the incidence surface 9B of the image forming lens 9 at a predetermined incidence angle iE. In the exposure device 1E, as shown in FIG. 8, the rotation center 2A of the photosensitive drum 2 is disposed off the center line 9A of the image forming lens 9 toward the opposite side of the LED microchip 4 in a way that a the photosensitive drum 2 confronts the LED microchip 4 with the image forming lens 9 interposed and also in a way that beam output from the center line 9A of the exit surface 9C of the image forming lens 9 at a predetermined exit angle iE perpendicularly strikes the circumferential surface of the photosensitive drum 2.

Further, the through-hole 25E is designed in a way that possible stray light 10 due to the reflection of light on the wires 6, 6A does not enter the incidence surface 9B of the image forming lens 9.

In the exposure device 1E, as shown in FIG. 8, a beam emitted from the light-emitting surface 3A of the LED array 3 diffuses radially. Part of the beam then enters the incidence surface 9B of the image forming lens 9 at the incidence angle iE as a proper beam 8. Subsequently the proceeds through the image forming lens 9 and then goes out from an exit surface 9C of the image forming lens 9 at a predetermined exit angle iE. Finally the beam strikes the circumferential surface of the photosensitive drum 2 to form a latent image on it.

Meanwhile, the stray light 10 strikes the top wall 32E of the light emitting space 21E but does not enter the incidence surface 9B of the image forming lens 9 directly.

In the exposure device 1E of the modification of the third embodiment ensures the same result as the exposure device 1C of the second embodiment, and the stray light 10 reflected on the wires 6 (6A) does not enter the image forming lens 9 directly when the driver elements 5 (5A) disposed both side of the LED microchips 4 are connected to the LED microchips 4 via wires 6 (6A).

(F) Other Modifications

The present invention should be by no means limited to the illustrated embodiments, and various other changes or modification may be suggested without departing the gist of the inventive concept.

For example, in these embodiments, the LED microchip 4 and the driver element 5 (5A) are connected immediately via the wire 6 (6A), which is known as a chip-to-chip interconnection method. Alternatively, a print board may interpose between the LED microchip 4 and the driver element 5 and may be connected each of the LED microchip 4 and the driver element 5 via wires respectively (method sometimes called indirect interconnection method).

Further, in these embodiments, the LED printer 14 includes four printing units 17. Alternatively, the printer may have only one printing unit serving as a unicolor printer or three printing units serving as a multi-color printer, so that the LED printer can have any number of printing units 17.

Furthermore, the individual of a plurality of printing units 17 mounted in the LED printer 14 may be any one of the illustrated exposure devices 1 through 1E, and the LED printer 14 may be a combination of the printing units 17 according to any of the illustrated exposure devices 1 through 1E. The illustrated exposure devices as much as possible can be combined.

The stray light may be generated at a plurality of wire balls and wires at the same time. The exposure device can reduce the possible incidence of stray light by adjusting an inclined angle of the image forming lens, shapes of the through-hole and the light-emitting space, a position of the photosensitive drum and so forth.

What is claimed is:

1. An exposure device for exposing an image supporting body, comprising:

a driver element;

a light emitting diode microchip connected to said driver element by wires and having a light emitting diode array for outputting light for exposure; and an image forming lens for directing the light output from said light emitting diode array of said light emitting diode microchip onto an image supporting body as exposure light;

said image forming lens being disposed in such a posture that the center line of said image forming lens is out of axial alignment with the center line of intensity distribution of the light output from said light emitting diode array on an incidence surface of said image forming lens, a center of rotation of said image supporting body being disposed off an extension of the center of intensity distribution of the last-named light output from said light emitting diode array;

said image forming lens assuming a posture such that possible incidence of stray light is reduced when local part of the light output from said light emitting diode array reflects on said wires.

2. An exposure device according to claim 1, wherein the center line of said image forming lens is disposed off the center line of intensity distribution of the light output of said light emitting diode array.

3. An exposure device according to claim 2, wherein the center line of said image forming lens extends parallel to the center line of intensity of distribution of the light output of said light emitting diode array.

4. An exposure device according to claim 2, wherein the center line of said image forming lens is inclined with respect to the center line of intensity distribution of the light output of said light emitting diode array.

5. An exposure device according to claim 2, wherein the center line of said image forming lens is disposed, toward a wire-free side of said light emitting diode microchip, off the center line of intensity distribution of the light output of said light emitting diode array.

6. An exposure device according to claim 2, wherein the individual wire connecting between said light emitting diode microchip and said driver element has a wire ball on at least one end, the center line of said image forming lens being disposed, toward a wire-free side of said light emitting diode microchip, off the center line of intensity distribution of the light output of said light emitting diode array.

7. An exposure device for exposing an image supporting body, comprising:
   a driver element;
   a light emitting diode microchip connected to said driver element by wires and having a light emitting diode array for outputting light for exposure; and
   an image forming lens for directing the light output from said light emitting diode array of said light emitting diode microchip onto an image supporting body as exposure light;
   said image forming lens being disposed in such an inclined posture that a first imaginary plane perpendicular to an incidence surface of said image forming lens crosses a second imaginary plane perpendicular to a light emitting surface of said light emitting diode array on the light emitting surface of said light emitting diode array,
   a center of rotation of said image supporting body being disposed off an extension of the center of intensity distribution of the last-named light output from said light emitting diode array;
   said image forming lens assuming a posture such that possible incidence of stray light is reduced when local part of the light output from said light emitting diode array reflects on said wires.

8. An exposure device according to claim 7, wherein the center line of said image forming lens is disposed, toward a wire-free side of said light emitting diode microchip, off the center line of intensity distribution of the light output of said light emitting diode array.

9. An exposure device according to claim 7, wherein the individual wire connecting between said light emitting diode microchip and said driver element has a wire ball on at least one end, the center line of said image forming lens being disposed, toward a wire-ball side of said light emitting diode microchip, off the center line of intensity distribution of the light output of said light emitting diode array.

10. An image forming machine comprising:
    an image supporting body to be charged with electricity;
    an exposure device for exposing said image supporting body, which is charged with electricity, to light to form a latent image on said image supporting body in terms of a pattern of areas left undischarged;
    a developing unit for applying a developer to said image supporting body, which is charged with electricity and is exposed to the light by said exposure device, so that the developer adheres only to the undischarged areas to bring the latent image into a visible image of the developer; and
    a transferring unit for transferring the developer of the visible image from said image supporting body onto a medium;
    said exposure device including
       a driver element,
       a light emitting diode microchip connected to said driver element by wires and having a light emitting diode array for outputting light for exposure, and
       an image forming lens for directing the light output from said light emitting diode array of said light emitting diode microchip onto said image supporting body as exposure light,
    said image forming lens being disposed in such a posture that the center line of said image forming lens is out of axial alignment with the center line of intensity distribution of the light output from said light emitting diode array on an incidence surface of said image forming lens,
    the center of rotation of said image supporting body being disposed off an extension of the center of intensity distribution of the last-named light output from said light emitting diode array;
    said image forming lens assuming a posture such that possible incidence of stray light is reduced when local part of the light output from said light emitting diode array reflects on said wires.

11. An image forming machine comprising:
    an image supporting body to be charged with electricity;
    an exposure device for exposing said image supporting body, which is charged with electricity, to light to form a latent image on said image supporting body in terms of a pattern of areas left undischarged;
    a developing unit for applying a developer to said image supporting body, which is charged with electricity and is exposed to the light by said exposure device, so that the developer adheres only to the undischarged areas to bring the latent image into a visible image of the developer; and
    a transferring unit for transferring the developer of the visible image from said image supporting body onto a medium;
    said exposure device including
       a driver element,
       a light emitting diode microchip connected to said driver element by wires and having a light emitting diode array for outputting light for exposure, and
    an image forming lens for directing the light output from said light emitting diode array of said light emitting diode microchip onto said image supporting body as exposure light, said image forming lens being disposed in such an inclined posture that a first imaginary plane perpendicular to an incidence surface of said image forming lens crosses a second plane perpendicular to a light emitting surface of said light emitting diode array on the light emitting surface of said light emitting diode array, the center of rotation of said image supporting body being disposed off an extension of the center of intensity distribution of the last-named light output from said light emitting diode array;

said image forming lens assuming a posture such that possible incidence of stray light is reduced when local part of the light output from said light emitting diode array reflects on said wires.

\* \* \* \* \*